United States Patent
Song

(10) Patent No.: US 6,927,168 B2
(45) Date of Patent: Aug. 9, 2005

(54) METHOD FOR MANUFACTURING SEMICONDUCTOR DEVICE

(75) Inventor: Young Taek Song, Seoul (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/727,825

(22) Filed: Dec. 4, 2003

(65) Prior Publication Data

US 2004/0266166 A1 Dec. 30, 2004

(30) Foreign Application Priority Data

Jun. 30, 2003 (KR) .................................. 10-2003-0043686

(51) Int. Cl.$^7$ ............................................. H01L 21/461
(52) U.S. Cl. ..................... 438/692; 438/691; 438/689; 438/279
(58) Field of Search ................................ 438/691–692, 438/689, 279

(56) References Cited

U.S. PATENT DOCUMENTS

| 6,177,320 B1 | * | 1/2001 | Cho et al. | 438/279 |
| 6,284,660 B1 | * | 9/2001 | Doan | 438/692 |
| 6,723,655 B2 | * | 4/2004 | Park et al. | 438/742 |

* cited by examiner

*Primary Examiner*—Luan Thai
(74) *Attorney, Agent, or Firm*—Marshall, Gerstein & Borun LLP

(57) ABSTRACT

A method of manufacturing a semiconductor device capable of polishing evenly and separating the adjacent word lines by performing the flattening process using slurry with a doping material added during the polishing process.

11 Claims, 3 Drawing Sheets

METHOD FOR MANUFACTURING SEMICONDUCTOR DEVICE

BACKGROUND

1. Technical Field

A method for manufacturing a semiconductor device is disclosed, that is capable of securing the stability in a polishing process for forming a landing plug.

2. Discussion of Related Art

Generally, a polishing process is performed for an electric isolation of word lines at the time of manufacturing a semiconductor. However, after the polishing process, an insulator film is over-dished due to differences of an etching rate between the insulator film deposited for insulating of the word lines and a poly silicon film for a landing plug (hereinafter also referred to as a "LP"). Thereby, slurry residues generated during the polishing process become to remain on an upper face of the insulator film over-dished. The aforementioned slurry residues are mostly composed of metal materials having electric conductivity, and they come to remain as they are because it is difficult to remove them through the following cleaning process. The residues, as described above, affect the electric separation of word lines, seriously.

The latest technologies decrease the polishing amount on the process to during the polishing process. However, in such a case, there are many problems in the electric separation of word lines, relatively. The reason is that the word lines of regions to be opened on forming a landing plug contact for LP are more attacked relatively than the other regions not to be opened, whereby the profile of upper word lines changes into a round shape. Therefore, the upper area of LP becomes to be larger and the electric separation margin of word lines gets more deteriorated. Though the polishing amount is increased again at the time of the polishing process to overcome these problems, the residual nitride film of word lines becomes to decrease, whereby the process of forming storage nodes and bit line self align contacts is affected and, furthermore, the short between these and tungsten silicide of word line would be generated.

SUMMARY OF THE DISCLOSURE

A method for manufacturing a semiconductor device is disclosed that is capable of securing the stability of a polishing process for forming a landing plug, and the electric separation of word lines in a stable manner.

According to an embodiment, a method for preventing a short from occurring improving the marginal space when forming storage nodes or bit line self align contacts, wherein a short otherwise could be generated between storage nodes or bit line self align contacts and word lines.

One disclosed method comprises preparing a semiconductor substrate defined as an active region and a field region; forming a number of word lines in the active region and the field region of the semiconductor substrate; depositing an insulator film over the upper part of a structure to insulate word lines; patterning the insulator film to open word lines of the active region whereby forming a landing plug contact; depositing a poly silicon film to fill up the landing plus contact; performing a first polishing process using slurry including a first doping material and flattening the poly silicon film only, whereby exposing the insulator film; a forming a landing plug by performing a second polishing process using slurry including a second doping material and by flattening all the upper part of the structure.

In the aforementioned of a method for manufacturing a semiconductor device according to another embodiment of the present invention, the first doping material is preferably boron and, the concentration of said boron is preferably in the range of 2 wt % to 5 wt %.

In the aforementioned of a method for manufacturing a semiconductor device according to another embodiment of the present invention, the second doping material is preferably phosphorus and, the concentration of said phosphorus is preferably in the range of 2 wt % to 5 wt %.

DETAILED DESCRIPTION OF THE PRESENTLY PREFERRED EMBODIMENTS

Now certain preferred embodiments will be described with reference to the accompanying drawings.

Figure 1:
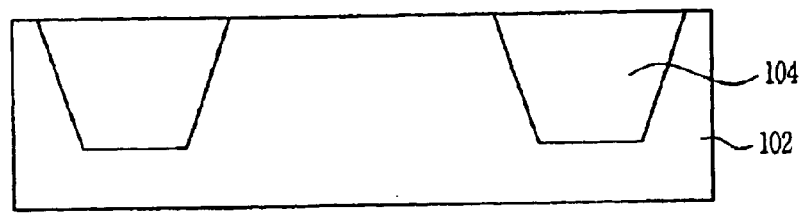
FIGS. 1 to 7 are cross-sectional views showing a semiconductor device for explaining a disclosed method for manufacturing a semiconductor device.

Referring to FIG. 1, a semiconductor substrate 102 is provided, wherein the semiconductor substrate is defined as an active region and a field region and it is cleaned by the cleaning process using at least one of diluted HF (DHF), SC-1, and BOE. A field oxide film 104 is formed in the field region of the semiconductor substrate 102. The field oxide film 104 is formed to have a trench structure using shallow trench isolation (STI) process or LOCal oxidation of silicon (LOCOS) process.

Figure 2:
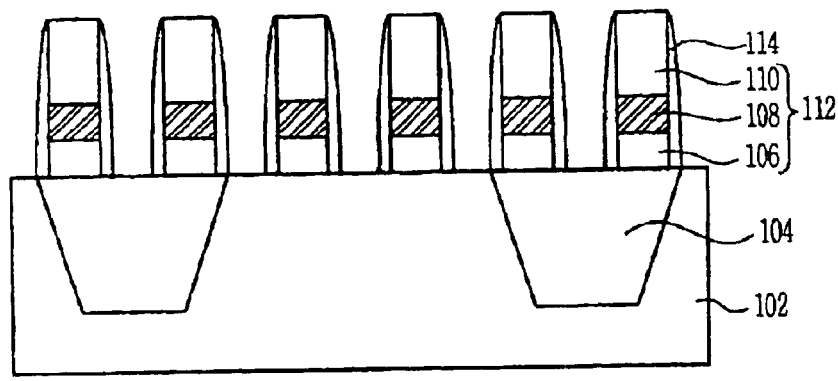

Referring to FIG. 2, a number of gate electrodes 112 (hereinafter, "word lines") are formed on the semiconductor substrate 102 including the active region and the field region, which is the field oxide film 104. Word lines 112 include the gate oxide film 106, the gate layer 108, and a hard mask layer 110. The gate layer 108 includes at least one of the poly silicon films or of the doped poly silicon films, or is formed to have the structure including poly silicon films and at least one of the insulator films between poly silicon films. The hard mask layer 110 is formed with the nitride film.

Subsequently, source and drain junction areas composed of low and high-density junction areas are formed on the semiconductor substrate, which is exposed to the both sides of word lines 112 in the active region and the field region. The low density junction area is formed by the lightly drain doped (LDD) ion-planting process. The high-density junction area is formed by the high density ion planting process using a mask as a spacer 114, wherein the spacer is formed in the both sides of word lines 112. On the other hand, the spacer 114 is formed with the nitride film thereof, or the stacked structure of the oxide film and the nitride film.

Figure 3:
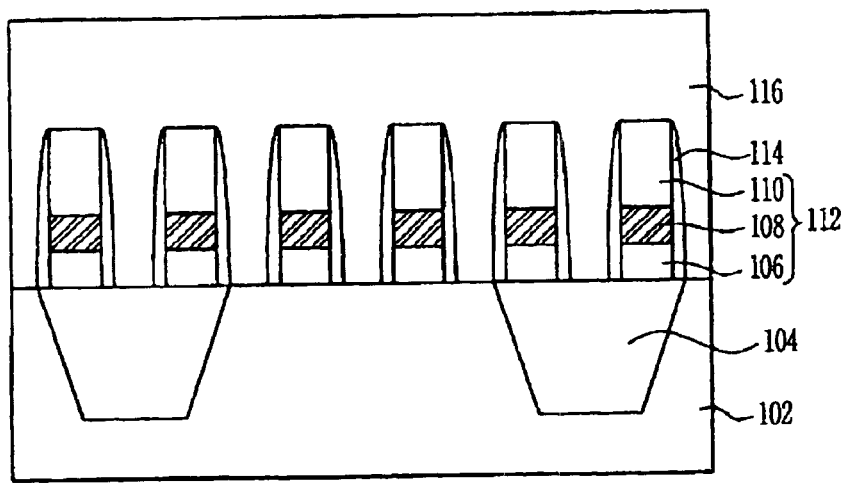

Referring to FIG. 3, the insulator film 116 is deposited over the upper part of the structure. The insulator film 116 separates word lines electrically which are formed adjacently in the active region and the field region. The insulator film 116 is formed using at least one of the group comprising spin on glass (SOG), un-doped silicate glass (USG), boron-phosphorus silicate glass (BPSG), phosphorus silicate glass (PSG), plasma enhanced tetra ethyl ortho silicate glass (PETEOS), and inter poly oxide (IPO). In addition, the insulator film 116 is deposited to fill the gap between word lines formed adjacently.

Figure 4:
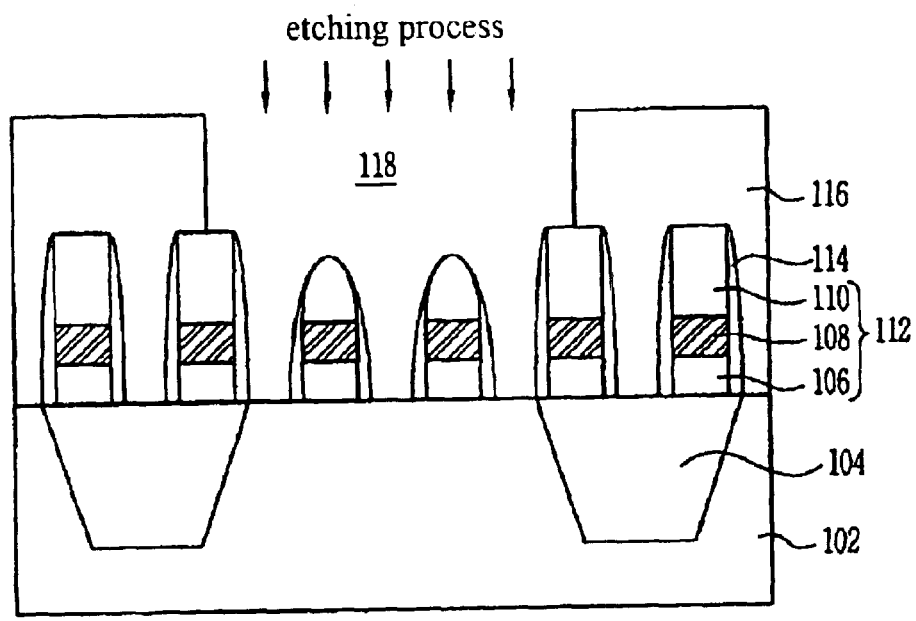

Referring to FIG. 4, a photoresist film is applied over the upper part of the structure, and then the photoresist pattern (not shown) opened locally is formed by performing exposure and development process using the photo mask, sequentially. It is preferable that the photoresist pattern is formed such that the active region is opened. In the following, the insulator film 116 is etched by the process using an etching mask as a photoresist pattern, resulting in landing plug contact (LPC) 118 formed. At this time, the etching process for forming LPC 118 is performed by a dry etching process requiring cheaper etching cost, however, preferably a plasma dry etching process.

Figure 5:
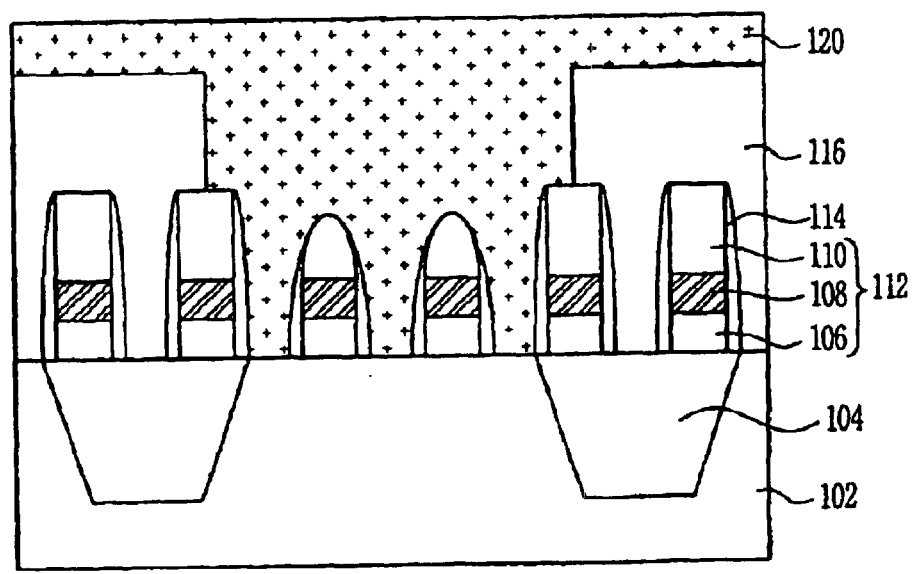

Referring to FIG. 5, the photoresist pattern used as the etching mask in FIG. 4 is removed through strip process. And then, the poly silicon film 120 for LP is deposited over the upper part of the structure to fill LPC 118. At this moment, it is preferable that the poly silicon film 120 for LP is deposited, thereby filling the gap between word lines formed in an LPC 118 region.

Figure 6:
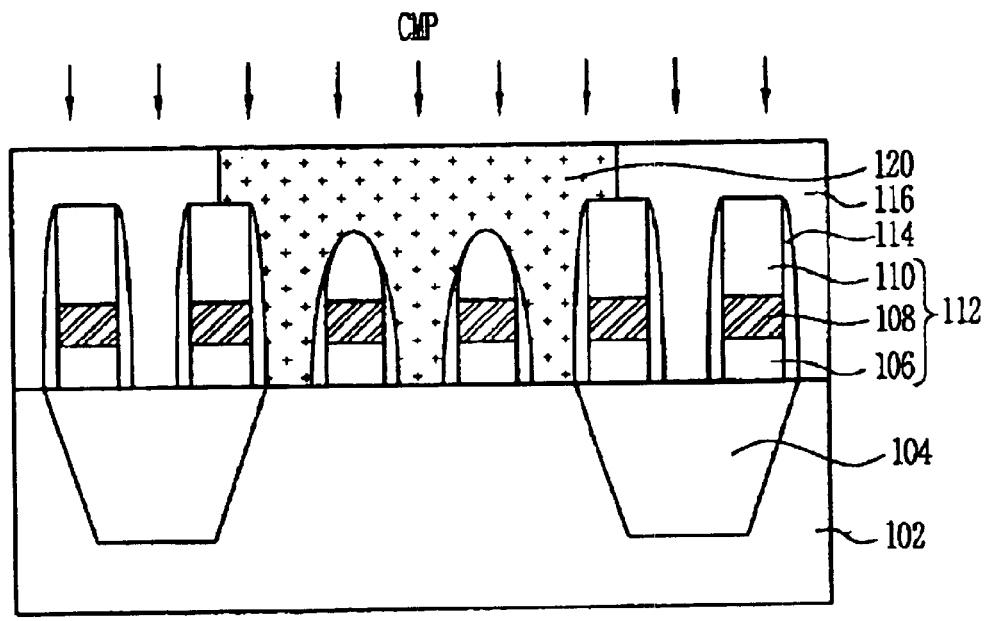

Referring to FIG. 6, the poly silicon film 120 for LP is flattened by performing a polishing process (hereinafter also referred to as "a $1^{st}$ polishing process") of chemical mechanical polishing (CMP) method over the upper part of the structure. In the $1^{st}$ polishing process, doping material for flattening the poly silicon film for LP 120 only is silica-based slurry with boron (B) added, for example. It is preferable that the concentration of B is in the range of 2 wt % to 5 wt %. In the $1^{st}$ polishing process, for example, it is possible that the pressure applied to the Main brain/Retain ring/Inner tube (M/R/I) of CMP equipment is in the range of 2 to 8 psi (pound/in$^2$), and P/H's rotation power of CMP equipment is in the range of 30 to 150 rpm.

Figure 7:
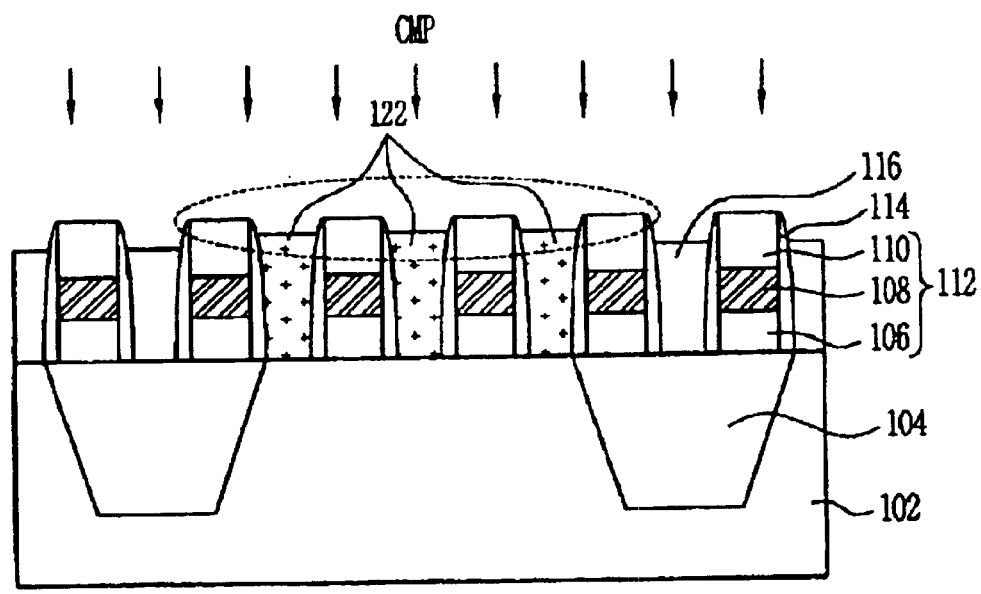

Referring to FIG. 7, a $2^{nd}$ polishing process is performed over the upper part of the structure. In the above $2^{nd}$ polishing process, for example, the slurry with phosphorus (P) added is used as a doping material for flattening the insulator film 116, the poly silicon film for LP 120 and the hard mask layer 110 at the same time. It is preferable that the concentration of P is in the range of 2 wt % to 5 wt %. In the $1^{st}$ polishing process, for example, it is possible that the pressure applied to the Main brain/Retain ring/Inner tube (M/R/I) of CMP equipment is in the range of 2 to 8 psi (pound/in$^2$), and P/H's rotation power of CMP equipment is in the range of 30 to 150 rpm. As a result, LP 122 is formed between word lines of the LPC region through the $2^{nd}$ polishing process.

It is therefore possible to polish evenly and separate the adjacent word lines stably by performing the flatteing process using slurry with a doping material added at the time of polishing process.

Moreover, it is possible to prevent a short from occurring by securing stably the polishing process for forming a landing plug stably and improving the marginal space when forming storage nodes or bit line self align contacts, wherein the short otherwise could be generated between the storage nodes or bit line self align contacts and word lines.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for manufacturing a semiconductor device comprising:
   preparing a semiconductor substrate with an active region and a field region;
   forming word lines in the active region and the field region of the semiconductor substrate;
   depositing an insulator film on top of the word lines;
   patterning the insulator film to open word lines in the active region to form a landing plug contact;
   depositing a poly silicon film to fill the landing plug contact;
   performing a first polishing process using a slurry including Boron and planarizing the poly silicon film and the insulator film only; and
   forming a landing plug by performing a second polishing process using a slurry including phosphorous and by polishing the poly silicon film, the insulator film and the hard mask.

2. The method of claim 1, wherein a concentration of the Boron is in the range of 2 wt % to 5 wt %.

3. The method of claim 1, wherein a concentration of the Phosphorus is in the range of 2 wt % to 5 wt %.

4. A method for manufacturing a semiconductor device comprising:
   preparing a semiconductor substrate having an active region and a field region;
   forming word lines in the active region and the field region of the semiconductor substrate;
   depositing an insulator film on top of the word lines;
   patterning the insulator film to open word lines in the active region to form a landing plug contact;
   depositing a poly silicon film to fill the landing plug contact and cover the insulator film;
   performing a first polishing process using slurry including a first doping material to increase an etching rate of the poly silicon film with respect to the insulating film to flatten the poly silicon film only and expose the insulator film; and
   forming a landing plug by performing a second polishing process using slurry including a second doping material to decrease the etching rate of the poly silicon film with respect to the insulating film and exposing the word lines.

5. The method of claim 4, wherein the first doping material is boron.

6. The method of claim 5, wherein a concentration of the boron is in the range of 2 wt % to 5 wt %.

7. The method of claim 6, wherein the second doping material is phosphorus.

8. The method of claim 7, wherein a concentration of the phosphorus is in the range of 2 wt % to 5 wt %.

9. The method of claim 5, wherein the second doping material is phosphorus.

10. The method of claim 4, wherein the second doping material is phosphorus.

11. The method of claim 10, wherein a concentration o the phosphorus is in the range of 2 wt % to 5 wt %.

* * * * *

UNITED STATES PATENT AND TRADEMARK OFFICE
CERTIFICATE OF CORRECTION

PATENT NO. : 6,927,168 B2 Page 1 of 1
APPLICATION NO. : 10/727825
DATED : August 9, 2005
INVENTOR(S) : Young T. Song It is certified that error appears in the above-identified patent and that said Letters Patent is hereby corrected as shown below:

In the Claims:

In Claim 7, column 4, line 49, please delete "claim 6" and insert -- claim 4 --.

In Claim 10, column 4, line 55, please delete "claim 4" and insert -- claim 6--.

In Claim 11, column 4, line 57, please delete "concentration o the" and insert -- concentration of the --.

Signed and Sealed this

Twenty-eighth Day of November, 2006

JON W. DUDAS
*Director of the United States Patent and Trademark Office*